(12) United States Patent
Lin

(10) Patent No.: US 10,115,653 B2
(45) Date of Patent: Oct. 30, 2018

(54) THERMAL DISSIPATION THROUGH SEAL RINGS IN 3DIC STRUCTURE

(71) Applicant: Taiwan Semiconductor Manufacturing Company, Ltd., Hsin-Chu (TW)

(72) Inventor: Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 375 days.

(21) Appl. No.: 14/599,834

(22) Filed: Jan. 19, 2015

(65) Prior Publication Data

US 2015/0129190 A1 May 14, 2015

Related U.S. Application Data

(63) Continuation of application No. 13/624,757, filed on Sep. 21, 2012, now Pat. No. 8,963,317.

(51) Int. Cl.
*H01L 23/10* (2006.01)
*H01L 23/34* (2006.01)
(Continued)

(52) U.S. Cl.
CPC .......... *H01L 23/367* (2013.01); *H01L 21/486* (2013.01); *H01L 21/50* (2013.01);
(Continued)

(58) Field of Classification Search
CPC ......... H01L 2225/06589; H01L 21/486; H01L 2225/06517; H01L 23/49827
(Continued)

(56) References Cited

U.S. PATENT DOCUMENTS 6,455,936 B1 * 9/2002 Lo ................... H01L 23/5383
257/730
8,021,927 B2 9/2011 Khan et al.
(Continued)

FOREIGN PATENT DOCUMENTS

CN 102386168 3/2012
KR 19980044539 9/1998
(Continued)

OTHER PUBLICATIONS

Lau, J. H., et al., "Thermal Management of 3D IC Integration with TSV (Through Silicon Via)," 2009 Electronic Components and Technology Conference, IEEE, pp. 635-640.
(Continued)

*Primary Examiner* — S. V. Clark
(74) *Attorney, Agent, or Firm* — Slater Matsil, LLP

(57) ABSTRACT

A package includes a die, which includes a semiconductor substrate, a plurality of through-vias penetrating through the semiconductor substrate, a seal ring overlapping and connected to the plurality of through-vias, and a plurality of electrical connectors underlying the semiconductor substrate and connected to the seal ring. An interposer is underlying and bonded to the die. The interposer includes a substrate, and a plurality of metal lines over the substrate. The plurality of metal lines is electrically coupled to the plurality of electrical connectors. Each of the plurality metal lines has a first portion overlapped by the first die, and a second portion misaligned with the die. A heat spreader encircles the die and the interposer. A wire includes a first end bonded to one of the plurality of metal lines, and a second end bonded to the heat spreader.

19 Claims, 7 Drawing Sheets

(51) Int. Cl.
*H01L 23/367* (2006.01)
*H01L 21/50* (2006.01)
*H01L 23/498* (2006.01)
*H01L 21/48* (2006.01)
*H01L 23/58* (2006.01)
*H01L 25/065* (2006.01)
*H01L 23/538* (2006.01)
*H01L 23/00* (2006.01)

(52) U.S. Cl.
CPC .......... *H01L 23/34* (2013.01); *H01L 23/3677* (2013.01); *H01L 23/49811* (2013.01); *H01L 23/49827* (2013.01); *H01L 23/5384* (2013.01); *H01L 23/585* (2013.01); *H01L 25/0657* (2013.01); *H01L 24/05* (2013.01); *H01L 24/06* (2013.01); *H01L 24/14* (2013.01); *H01L 24/16* (2013.01); *H01L 24/45* (2013.01); *H01L 24/48* (2013.01); *H01L 24/73* (2013.01); *H01L 2224/0401* (2013.01); *H01L 2224/04042* (2013.01); *H01L 2224/0557* (2013.01); *H01L 2224/05548* (2013.01); *H01L 2224/05568* (2013.01); *H01L 2224/05572* (2013.01); *H01L 2224/06181* (2013.01); *H01L 2224/131* (2013.01); *H01L 2224/13024* (2013.01); *H01L 2224/13082* (2013.01); *H01L 2224/13147* (2013.01); *H01L 2224/14181* (2013.01); *H01L 2224/16145* (2013.01); *H01L 2224/16146* (2013.01); *H01L 2224/16225* (2013.01); *H01L 2224/16238* (2013.01); *H01L 2224/45124* (2013.01); *H01L 2224/45144* (2013.01); *H01L 2224/45147* (2013.01); *H01L 2224/48247* (2013.01); *H01L 2224/48464* (2013.01); *H01L 2224/73207* (2013.01); *H01L 2224/73257* (2013.01); *H01L 2225/0651* (2013.01); *H01L 2225/06513* (2013.01); *H01L 2225/06517* (2013.01); *H01L 2225/06541* (2013.01); *H01L 2225/06589* (2013.01); *H01L 2924/00014* (2013.01); *H01L 2924/1431* (2013.01); *H01L 2924/1434* (2013.01); *H01L 2924/15173* (2013.01); *H01L 2924/15311* (2013.01); *H01L 2924/19107* (2013.01)

(58) Field of Classification Search
USPC .................. 257/706, 707, 758; 438/122, 125
See application file for complete search history.

(56) References Cited

U.S. PATENT DOCUMENTS

| | | | |
|---|---|---|---|
| 8,928,159 B2 | 1/2015 | Chang et al. | |
| 9,013,035 B2* | 4/2015 | Zhao | H01L 23/367 257/706 |
| 2003/0122220 A1 | 7/2003 | West et al. | |
| 2005/0098893 A1 | 5/2005 | Tsutsue et al. | |
| 2006/0065972 A1* | 3/2006 | Khan | H01L 23/13 257/712 |
| 2010/0171203 A1 | 7/2010 | Chen et al. | |
| 2010/0187670 A1 | 7/2010 | Lin et al. | |
| 2010/0237472 A1 | 9/2010 | Gillis et al. | |
| 2011/0037163 A1* | 2/2011 | Lachner | H01L 21/561 257/693 |
| 2011/0176278 A1 | 7/2011 | Park et al. | |
| 2012/0049339 A1 | 3/2012 | Wang | |
| 2012/0056315 A1 | 3/2012 | Chang et al. | |
| 2012/0305916 A1* | 12/2012 | Liu | H01L 22/34 257/48 |
| 2013/0082383 A1* | 4/2013 | Aoya | H01L 23/13 257/738 |
| 2013/0105982 A1 | 5/2013 | Jin et al. | |
| 2014/0084444 A1 | 3/2014 | Lin | |
| 2014/0084476 A1* | 3/2014 | Lin | H01L 23/48 257/774 |

FOREIGN PATENT DOCUMENTS

| | | |
|---|---|---|
| KR | 1020100081934 | 7/2010 |
| KR | 100991623 | 10/2010 |
| TW | 201125073 | 7/2011 |
| TW | 201201351 | 1/2012 |
| TW | 200629521 | 12/2014 |

OTHER PUBLICATIONS

Nakanekar, S., et al., "Optimal Thermal Characterization of a Stacked Die Package With TSV Technology," 13th IEEE ITHERM Conference, 2012, IEEE, pp. 130-136.

Yamaji, Y., et al., "Thermal Characterization of Bare-die Stacked Modules with Cu through-vias," 2001 Electronic Components and Technology Conference, IEEE, 8 pgs.

* cited by examiner

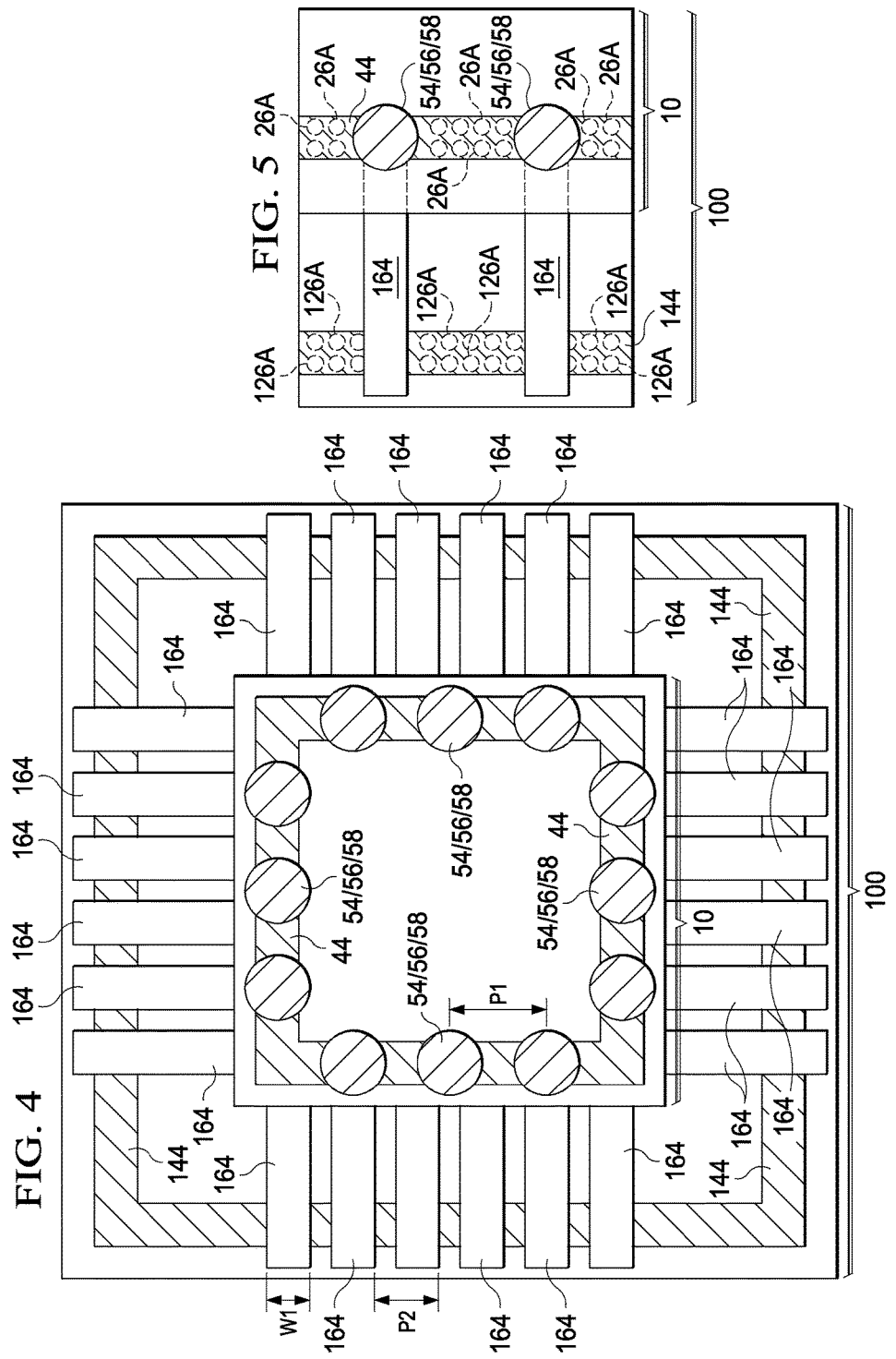

THERMAL DISSIPATION THROUGH SEAL RINGS IN 3DIC STRUCTURE

PRIORITY CLAIM AND CROSS-REFERENCE

This application is a continuation of U.S. patent application Ser. No. 13/624,757, entitled "Thermal Dissipation Through Seal Rings in 3DIC Structure," filed on Sep. 21, 2012, which application is incorporated herein by reference.

CROSS-REFERENCE TO RELATED APPLICATIONS

This application relates to the following co-pending U.S. patent applications: application Ser. No. 13/624,471, filed Sep. 21, 2012, and entitled "Thermal Dissipation Through Seal Rings in 3DIC Structure," and application Ser. No. 13/624,620, filed Sep. 21, 2012, and entitled "Thermal Dissipation Through Seal Rings in 3DIC Structure," which applications are hereby incorporated herein by reference.

BACKGROUND

In the packaging of integrated circuits, semiconductor dies may be stacked through bonding, and may be bonded to other package components such as interposers. The resulting packages are known as Three-Dimensional Integrated Circuits (3DICs). The heat dissipation is a challenge in the 3DICs. There exists a bottleneck regarding how to efficiently dissipate the heat generated in the inner dies of the 3DICs. The heat generated in the inner dies has to be dissipated to outer dies before it can be conducted to any heat spreader. Between the stacked dies, however, there exist other materials such as underfill, molding compound, etc, which are not effective in conducting heat.

The solutions for improving the heat dissipation are being developed. For example, micro-channels may be built inside silicon substrates for heat dissipation. Although the micro-channels may be filled with materials or fluids having a good thermal conductivity to improve the overall heat dissipation efficiency of the resulting device die, the manufacturing cost and time-to-market of the device dies became an issue.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 4 and 5 illustrate the top views of the package structures in FIGS. 2 and 3;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package structure is provided in accordance with various exemplary embodiments. The variations and the operation of the package structure in accordance with embodiments are discussed. Throughout the various views and illustrative embodiments, like reference numbers are used to designate like elements.

Figure 1:
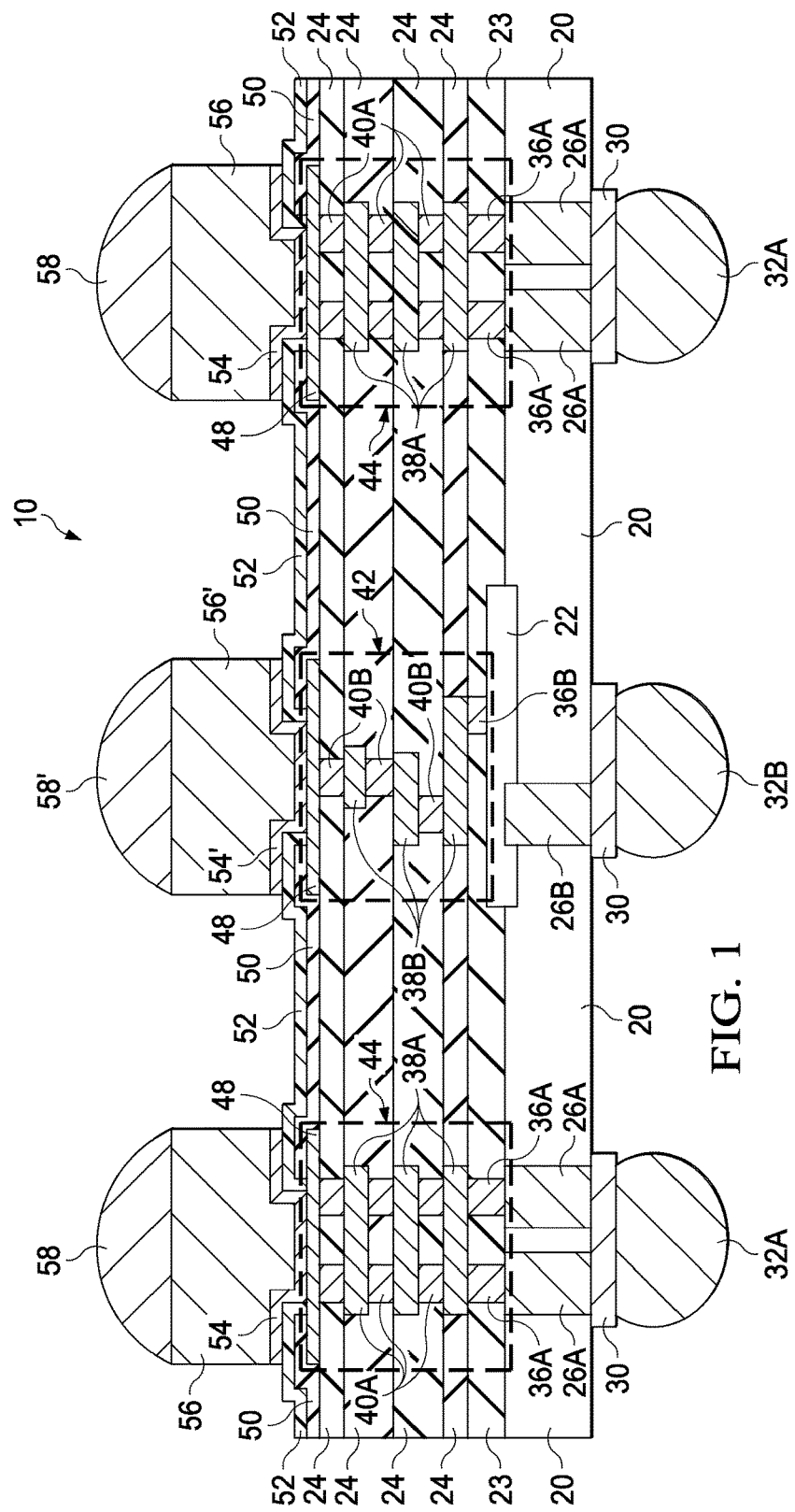
FIG. 1 illustrates a cross-sectional view of a die in accordance with some exemplary embodiments, wherein the die includes a seal-ring-comprising thermal dissipating path for dissipating heat.

FIG. 1 illustrates a cross-sectional view of die 10 in accordance with exemplary embodiments. Die 10 includes semiconductor substrate 20, which may be formed of silicon, silicon germanium, silicon carbon, or a group-III and group-V containing compound semiconductor material. Semiconductor substrate 20 may be lightly doped with a p-type impurity, for example. Active devices 22 such as transistors may be formed at a top surface of substrate 20.

Through Vias (also referred to as through-silicon vias or through-substrate vias) 26A and 26B are formed in, and penetrate through, substrate 20. In the illustrative embodiments, through-vias 26A and 26B have top surfaces level with the top surface of substrate 20. In alternative embodiments, the top surfaces of through-vias 26A and 26B may also be level with or higher than the top surfaces of Inter-Layer Dielectric (ILD) 23. Although a single through-via 26B is illustrated, the single through-via 26B represents a plurality of through-vias 26B. Through vias 26A and 26B are conductive, and may comprise metallic materials such as copper, tungsten, or the like. Backside Redistribution Lines (RDLs) 30 are formed underlying substrate 20, and are electrically coupled to through-vias 26A and 26B. Furthermore, connectors 32 (including 32A and 32B) are formed underlying and electrically coupled to RDLs 30. In some embodiments, connectors 32 comprise solder regions (such as solder balls), although they may also comprise non-reflowable metal pillars such as copper pillars.

Overlying substrate 20 reside dielectric layers 23 and 24. Dielectric layer 23 may be an ILD, which may be formed of Phospho-Silicate Glass (PSG), Boro-Silicate Glass (BSG), Boron-Doped Phospho-Silicate Glass (BPSG), Tetraethyl Orthosilicate (TEOS) oxide, or the like. Dielectric layers 24 may be low-k dielectric layers, which may have dielectric constants (k values) lower than about 3.0, or lower than about 2.5, for example.

In some embodiments, contact plugs 36B are formed in ILD 23, and are electrically coupled to through-vias 26B and/or overlying metal lines 38B and vias 40B. Metal lines 38B and vias 40B are formed in low-k dielectric layers 24, and are portions of interconnect structure 42. Interconnect structure 42 is used for connecting to devices 22, and for coupling devices 22 to the overlying conductive features 54', 56', and 58', which may be used for bonding to an overlying die (shown in FIGS. 2 and 3). It is appreciated that although one set of interconnect structure 42 is illustrated, with one metal line and via illustrated in each of dielectric layers 24, there may be many metal lines, vias, contact plugs etc., in each of dielectric layers 24.

Seal ring 44 is formed over and connected to through-vias 26A. Seal ring 44 forms a ring proximate the edges of die 10, as illustrated in FIG. 4 also. In some embodiments, seal ring 44 includes metal lines 38A and vias 40A in low-k dielectric layers 24. Seal ring 44 may also include contact plugs 36A when through-vias 26A do not extend into ILD 23. In some embodiments, each of metal lines 38A, vias 40A, and contact plugs 36A may form a ring (in a top view of the structure in FIG. 1) proximate the edges of die 10.

Metal pads 48 are formed over, and connected to, seal ring 44. In some embodiments, metal pads 48 are discrete pads that are separated from each other. In alternative embodiments, metal pads 48 are portions of a continuous metal ring that overlaps seal ring 44, wherein the top-view shape of the continuous metal ring may be similar to the top-view shape of seal ring 44 in FIG. 4. Metal pads 48 may be aluminum pads or aluminum-copper pads. In some embodiments, passivation layer 50 is formed to cover the edge portions of metal pads 48. The central portions of metal pads 48 are exposed through the openings in passivation layer 50. Passivation layer 50 may be a single layer or a composite layer, and may be formed of a non-porous material. In some embodiments, passivation layer 50 is a composite layer comprising a silicon oxide layer (not shown), and a silicon nitride layer (not shown) over the silicon oxide layer. Passivation layer 50 may also comprise Un-doped Silicate Glass (USG), silicon oxynitride, and/or the like. Although one passivation layer 50 is shown, there may be more than one passivation layer.

Polymer layer 52 may be formed over passivation layer 50. Polymer layer 52 may comprise a polymer such as polyimide, benzocyclobutene (BCB), polybenzoxazole (PBO), and the like. Polymer layer 52 is patterned to form openings, through which metal pads 48 are exposed. The patterning of polymer layer 52 may be performed using photo lithography techniques. Although one polymer layer 52 is shown, there may be more than one polymer layer.

Under-Bump Metallurgies (UBM) 54 may be formed over metal pads 48. Each of UBMs 54 may comprise a first portion over polymer layer 52, and a second portion extending into the opening in polymer layer 52. In some embodiments, each of UBMs 54 includes a titanium layer and a seed layer, which may be formed of copper or copper alloys. Metal pillars 56 are formed over UBM 54, and are coterminus with UBM 54, wherein the edges of UBM 54 are aligned to respective edges of metal pillars 56. UBMs 54 may be in physical contact with the respective underlying metal pads 48 and the overlying metal pillars 56. In some exemplary embodiments, metal pillars 56 are formed of a non-reflowable metal(s) that does not melt in reflow processes. For example, metal pillars 56 may be formed of copper or a copper alloy. In addition to metal pillars 56, there may be additional metal layers such as solder regions 58 over metal pillars 56. Metallic features 54', 56', and 58' may be formed of the same materials as, and formed simultaneously with, features 54, 56, and 58, and may be used for electrically coupling to devices 22.

As shown in FIG. 1, seal ring 44, metal pads/line 48, UBMs 54, metal pillars 56, solder regions 58, contact plugs 36A, through-vias 26A, RDLs 30, and connectors 32A form an integrated structure 60, and may all be metal-containing regions. Accordingly, integrated structure 60 has a good thermal conductivity, and hence is referred to as seal-ring-comprising thermal path 60 hereinafter. In some embodiments, seal-ring-comprising thermal path 60 is connected to electrical ground. In alternative embodiments, seal-ring-comprising thermal path 60 is electrically floating.

Figure 2:
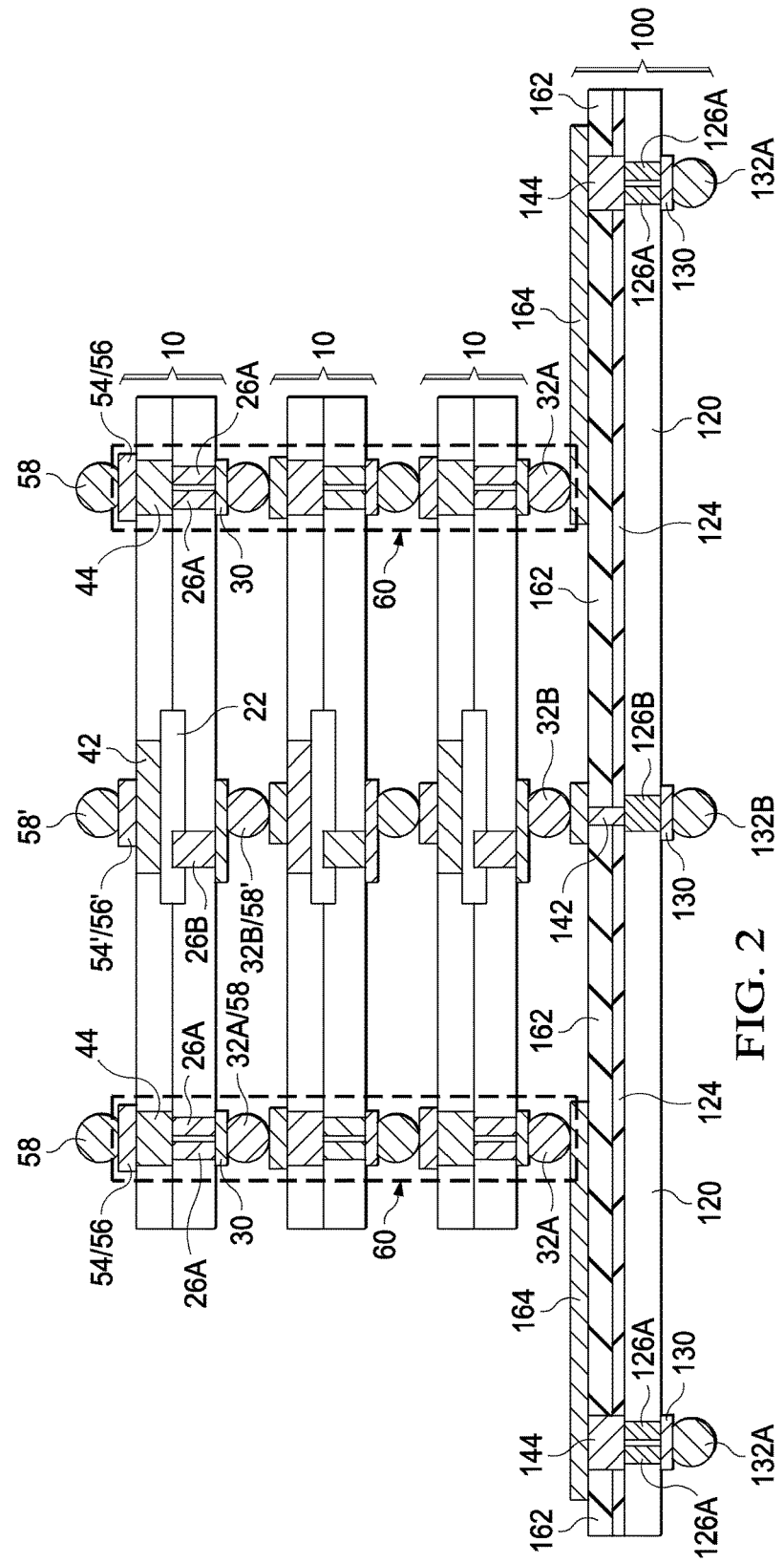
FIGS. 2 and 3 are cross-sectional views of a package structure, which includes stacked dies bonded to an interposer.

FIG. 2 illustrates a Three-Dimensional Integrated Circuit (3DIC) package including dies 10 stacked on package component 100. In some embodiments, package component 100 is an interposer, and hence is referred to as interposer 100 throughout the description, although package component 100 may also be of other types of package components such as a package substrate. In some embodiments, dies 10 are identical to each other. In alternative embodiments, the structures of dies 10 are different from each other. Dies 10 may be memory dies, logic dies, or the like. All of dies 10, or some but not all of dies 10, may have the structure as in FIG. 1. For clarification, a simplified structure of dies 10 is illustrated in FIG. 2, wherein solder regions 32A/32B and 58, metal pillars 56, seal rings 44, interconnect structure 42, through-vias 26A and 26B, and RDLs 30 are illustrated, while other components may not be illustrated, although they may still exist. The detailed structures of seal rings 44 and interconnect structure 42 are not shown in FIG. 2, and may be found referring to FIG. 1.

Dies 10 are stacked, for example, with pre-solder regions 58 and connectors 32A bonded to each other, and pre-solder regions 58' and connectors 32B bonded to each other through reflowing. Active devices 22 in different dies 10 may also be electrically interconnected through through-vias 26B. Under stacked dies 10 is interposer 100, which is bonded to stacked dies 10, for example, through solder bonding. In some embodiments, interposer 100 comprises substrate 120, which may be a semiconductor substrate such as a silicon substrate, or may be a dielectric substrate. Through-vias 126A and 126B penetrate through substrate 120, and may interconnect conductive features (such as 132A/132B and 164) on opposite sides of substrate 120. In some embodiments, interposer 100 does not comprise any active device such as transistor therein. Interposer 100 may, or may not, comprise passive devices such as resistors, capacitors, or the like, therein.

Through the stacking of dies 10, seal-ring-comprising thermal paths 60 in different dies 10 are interconnected to form a continuous seal-ring-comprising thermal path. Hence, the heat generated in dies 10 may be conducted through the continuous seal-ring-comprising thermal path.

Interposer 100 may also include seal ring 144 proximate the edges of interposer 100. Furthermore, interconnect structure 142 is formed in interposer 100, and may be electrically coupled to active devices 22 in dies 10. Seal ring 144 and interconnect structure 142 may have structures similar to that of seal ring 44 and interconnect structure 42, respectively, which include metal lines and vias in dielectric layers. Seal rings 144 and interconnect structure 142 may further comprise portions in dielectric layers 124, which may, or may not, include low-k dielectric materials. Furthermore, dielectric layer 162 is formed on the top surface of interposer 100. Dielectric layer 162 may include a polymer layer such as a polyimide layer, and may also include passivation layer(s). RDLs 130 and connectors 132 (including 132A and 132B) are formed underlying, and connected to, through-vias 126A and 126B, respectively.

Metal lines 164 may be formed over, and connected to, seal ring 144. In some embodiments, metal lines 164 comprise copper lines. Interposer 100 and metal lines 164 comprise portions overlapped by dies 10, and portions not overlapped by dies 10. Metal lines 164 are further bonded to solder regions 32A and 32B of the overlying die 10. Accordingly, the interconnected seal-ring-comprising thermal path 60 is further expanded to include metal lines 164, seal ring 144, and connectors 132A, which may all be metal-containing features. In some embodiments, when the package as shown in FIG. 2 is operated (powered on), seal-ring-comprising thermal path 60 remains electrically floating or electrically grounded. In some embodiments, seal-ring-comprising thermal path 60 is used for conducting heat, and is not used for conduct electrical signals, currents, or the like. In the illustrated embodiments, heat may be conducted upwardly through seal-ring-comprising thermal path 60, and downwardly to metal lines 164, seal ring 144, through-vias 126A, and conductors 132A in interposer 100.

Figure 3:
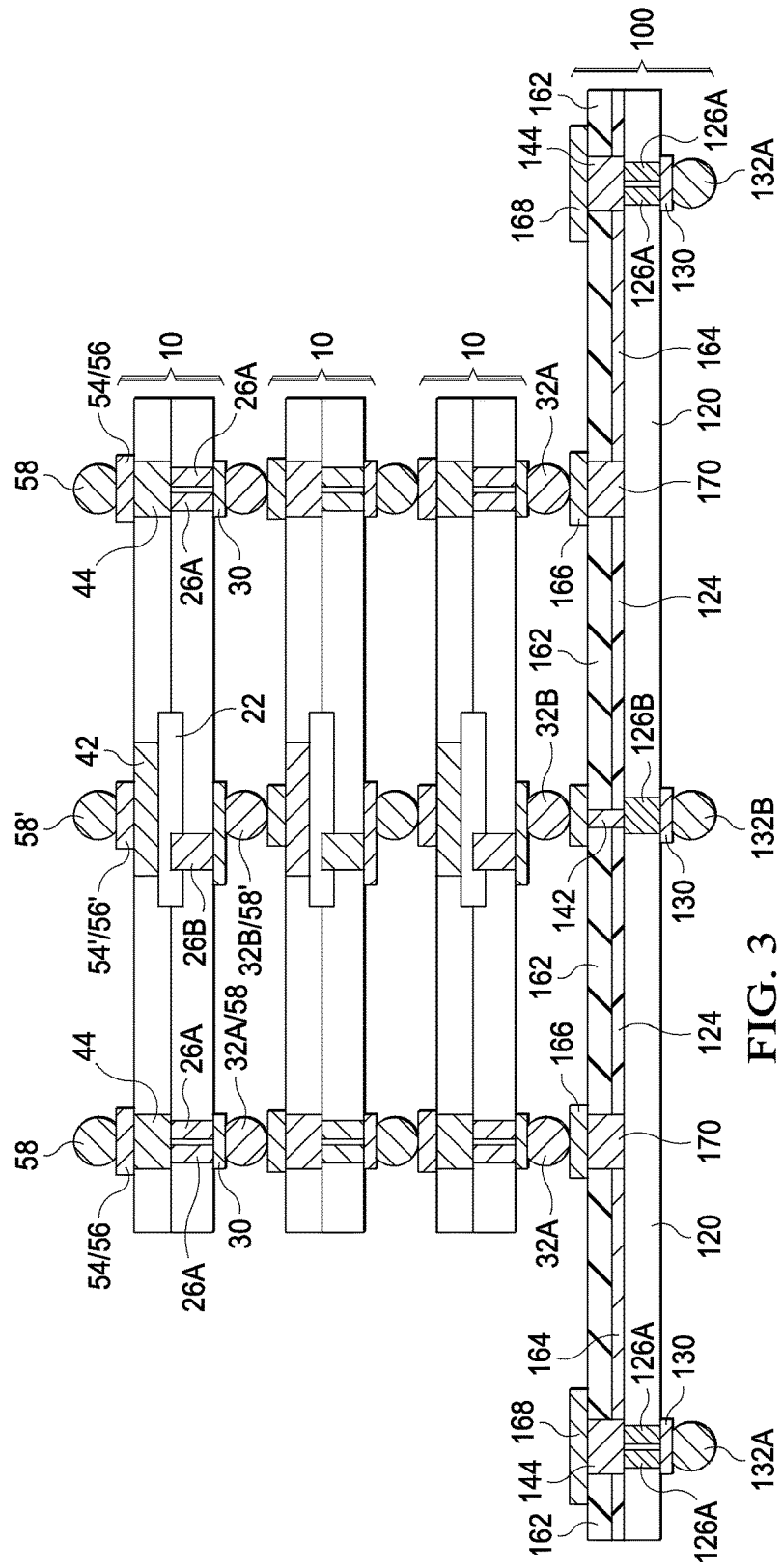

FIG. 3 illustrates a package structure in accordance with alternative embodiments. This structure is similar to the structure in FIG. 2, except that metal lines 164, instead of being formed over dielectric layer 162, are formed under dielectric layer 162, which may comprise a polymer layer. For example, metal lines 164 may be underlying dielectric layer 162 that is formed of polyimide. Discrete metal pads 166 and 168 are formed over dielectric layer 162, and are electrically coupled to each other through metal line 164. Connectors 32A may be bonded to metal pads 166, which are overlapped by dies 10, while metal pads 168 are not overlapped by dies 10. Metal lines 164 may be aluminum copper lines in some embodiments. Furthermore, seal ring 144 and interconnect structure 142 may extend to the same layer as metal lines 164. Metal pads 166 and 168 are inter-coupled through seal ring 144 and metal features 170 in these embodiments. Metal features 170 are in the same layer, and may be formed of a same material, as metal lines 164. In these embodiments, seal-ring-comprising thermal path 60 further expands into interposer 100 to include metal pads 166 and 168, metal feature 170, and possibly a portion of seal ring 144. The heat generated in dies 10 may thus be conducted to metal pads 166 and 168 and conductors 132A through the interconnected seal-ring-comprising thermal paths 60 in dies 10. Seal-ring comprising thermal paths 60 in accordance with these embodiments may also be electrically floating or may be electrically grounded.

FIG. 4 illustrates a top view of portions of dies 10 and interposer 100 in accordance with some embodiments. As shown in FIG. 4, seal ring 44 forms a full ring, which may include four sides, each adjacent to one edge of the respective die 10. Features 54/56/58 are formed overlying and connected to seal ring 44. Features 54/56/58 may be spaced apart from each other with a substantially uniform pitch P1, which may be between about 0.4 μm and about 50 μm. The top view shapes of solder regions 58 may be circles or ovals. Metal lines 164 may be arranged as parallel metal lines that extend from die 10 outwardly to seal ring 144. Width W1 and the thickness of metal lines 164 may be increased to increase the heat dissipation efficiency. Pitch P2 of metal lines 164 may also be reduced to increase the heat dissipation efficiency.

FIG. 5 illustrates a top view of a portion of the package structure in FIGS. 2 and 3. As shown in FIG. 5, metal lines 164 connect seal ring 44 in dies 10 to seal ring 144 in interposer 100, so that the heat generated in dies 10 may be dissipated to metal lines 164, and to seal ring 144. FIG. 5 also illustrates through-vias 26A in dies 10, and through-vias 126A in interposer 100.

Figure 6A:
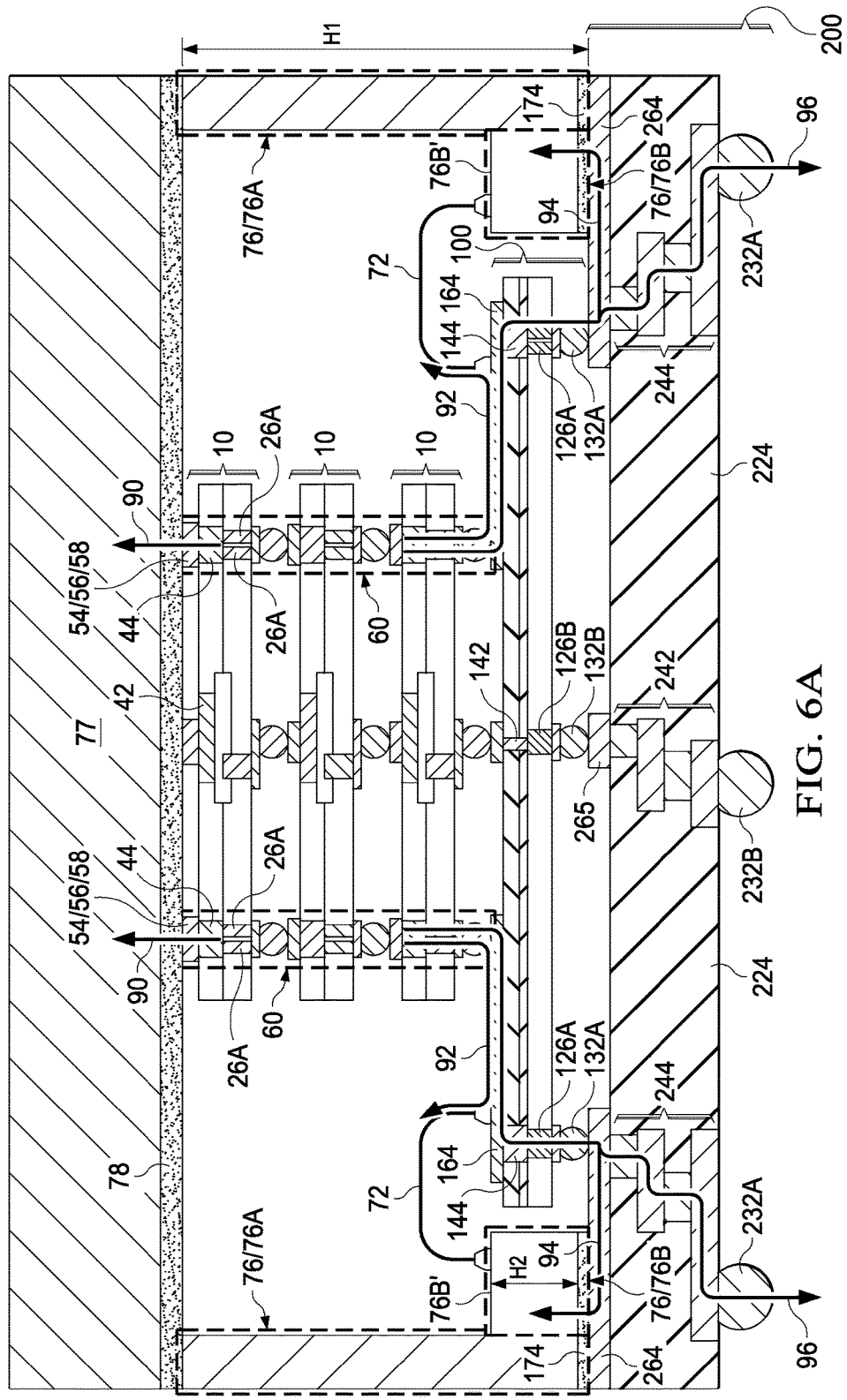
FIGS. 6A and 6B illustrate a cross-sectional view and a top view, respectively, of a package in accordance with exemplary embodiments, wherein the package comprises a heat spreader mounted on the interposer, a package substrate bonded to the interposer, and an additional heat spreader over the heat spreader.

FIG. 6A illustrates a package comprising the structure in FIG. 2 or 3 therein. For simplicity, the illustrated package includes the structure in FIG. 2. It is appreciated that a similar package may also be made to modify the package in FIG. 6A by replacing the structure in FIG. 2 with the structure in FIG. 3. As shown in FIG. 6, package component 200 is underlying and bonded to interposer 100. In some embodiments, package component 200 is a package substrate (which may be a laminate substrate or a built-up substrate), and hence is referred to as package substrate 200 hereinafter, although it may also be another type of package component. Package substrate 200 includes metal lines 264 that are bonded to connectors 132A of interposer 100. Furthermore, each of metal lines 264 may comprise a portion overlapped by interposer 100, and a portion not overlapped by interposer 100. In accordance with embodiments, metal lines 264 may be electrically floating or electrically grounded.

Package substrate 200 may include dielectric layers 224, and metal traces 244 in dielectric layers 224. Metal traces 244 are electrically coupled to connectors 132A and metal lines 264, with metal lines 264 and connectors 132A being on the opposite sides of package substrate 200. Connectors 232A are underlying metal trace 244. Package substrate 200 also includes metal traces 242, which are electrically coupled to connectors 132B. Metal traces 242 are further connected to metal pad 265, which is bonded to one underlying connector 132B. Although one set of metal traces 242, one metal pad 265, and one connector 232B are illustrated, package substrate 200 may include many of these features. Connectors 232A and 232B may be solder regions such as solder balls, metal pillars, composite connectors including metal pillars and pre-solder regions, and the like. In some embodiments, when the package in FIG. 6A is operated (powered on), metal lines 264, metal traces 244, seal ring 144, and seal-ring-comprising thermal path 60 may be either electrically floating or electrically grounded.

Heat spreader 76 is mounted on package substrate 200 through adhesive layer 174. In some embodiments, adhesive layer 174 comprises a Thermal Interface Material (TIM), which is a material that has a high thermal conductivity than typical adhesives. As also shown in FIG. 6A, thermal conductive film 78 is disposed underlying upper portion 76B of heat spreader 76, and overlapping dies 10. Thermal conductive film 78 has a high thermal conductivity, and may be formed of a TIM. Accordingly, thermal conductive film 78 acts as an adhesive, and also functions to conduct the heat from dies 10 to heat spreader 76. In some embodiments, metal pillars 56 (or solder region 58, if any) in the top die 10 may be in contact with thermal conductive film 78 to have a good thermal conduction.

Figure 6B:
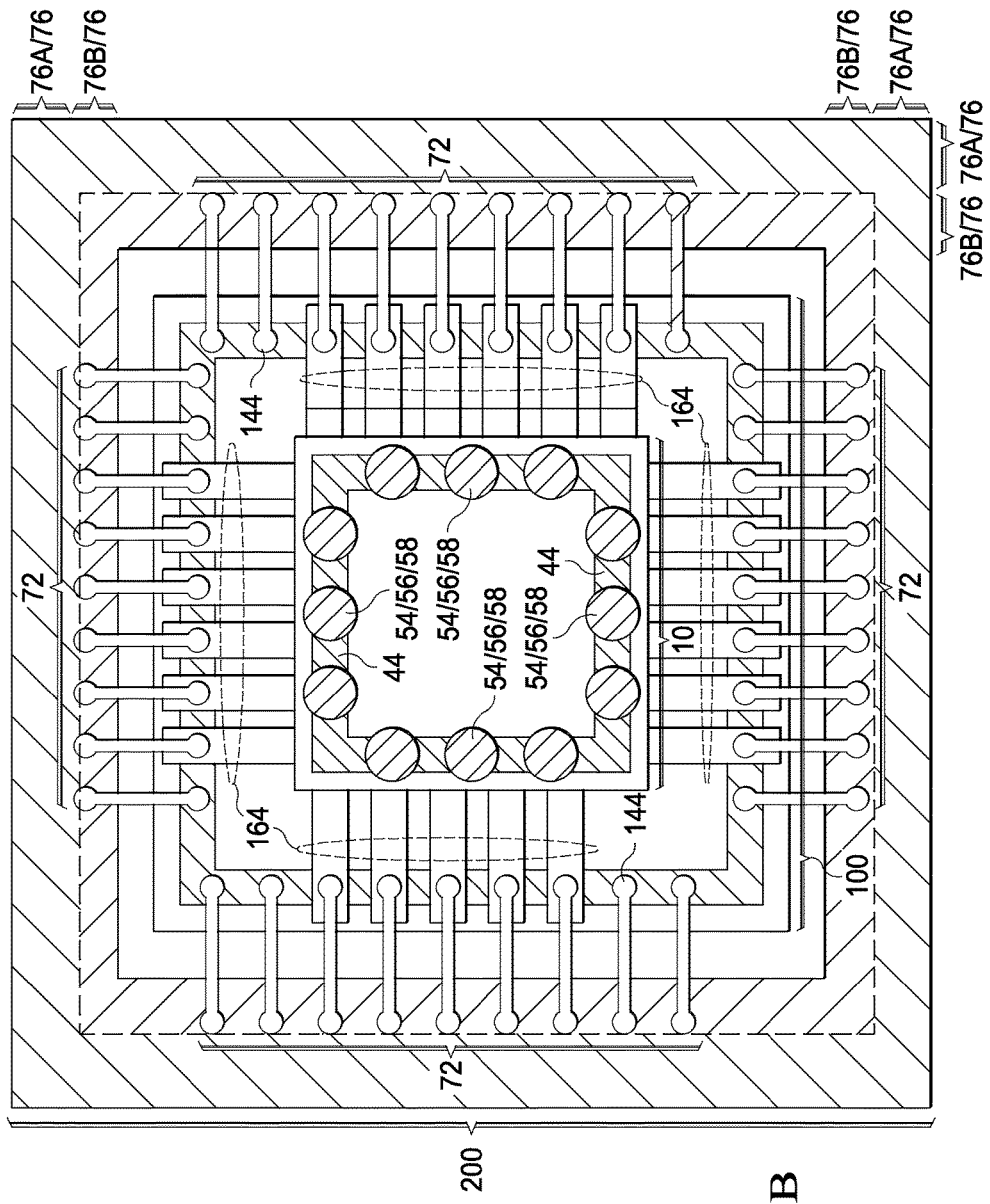

Heat spreader 76 may have a top-view shape of a ring, which may have four sides encircling a rectangular region. An exemplary top view of heat spreader 76 is illustrated in FIG. 6B. In some embodiments, heat spreader 76 includes portions 76A and 76B, wherein height H1 of portion 76A is greater than height H2 of portion 76B. The top surface of portion 76A may be in contact with thermal conductive film 78. Each of portions 76A and 76B may form a ring encircling interposer 100 and dies 10 (refer to FIG. 6B). The top surface 76B' of portion 76B is used to bond metal wires 72 through wire bonding. The other ends of metal wires 72 may be bonded to metal lines 164 through wire bonding. Relatively thick metal wires 72 may be used, which may have diameters ranging from about 50 μm to about 80 μm, for example, although different diameters may be used. Metal wires 72 may be gold wires, copper wires, aluminum wires, or the like.

The top surface of portion 76A of heat spreader 76 may be in contact with thermal conductive film 78, so that the heat in heat spreader 76 may be conducted to heat spreader 77. As also shown in FIG. 6A, thermal conductive film 78 is disposed underlying heat spreader 77, which overlaps heat spreader 76 and dies 10. Thermal conductive film 78 has a high thermal conductivity, and may be formed of a TIM, for example. Accordingly, thermal conductive film 78 acts as an adhesive, and also functions to conduct the heat from dies 10 upwardly to heat spreader 77. In some embodiments, metal pillars 56 (or solder region 58, if any) in the top die 10 are in contact with thermal conductive film 78 to have a good thermal conduction.

In the package shown in FIG. 6A, the heat generated in dies 10 has four conducting paths. In the first paths 90, the heat is conducted to heat spreader 77 through seal-ring-comprising thermal paths 60 and thermal conductive film 78. In the second paths 92, the heat is conducted through seal-ring-comprising thermal paths 60, metal lines 164, metal wires 72, and to heat spreader 76. In the third paths 94, the heat is conducted through seal-ring-comprising thermal paths 60, metal lines 164, through-vias 126A, metal lines 264, adhesive layers 174, and to heat spreader 76. In the fourth paths 96, the heat is conducted through seal-ring-comprising thermal paths 60, metal lines 164, through-vias 126A, metal lines 264, metal traces 244, and to connectors 232A. With multiple heat spreading paths, the heat efficiency is improved. In some embodiments, the entirety of the thermal path from seal-ring-comprising thermal paths 60 to connectors 232A is formed of metal-containing features, and no dielectric material is inserted therein to separate the metal-containing features. Accordingly, the thermal conductivity of the entire fourth thermal path is high.

FIG. 6B illustrates a top view of the structure in FIG. 6A in accordance with exemplary embodiments. As shown in FIG. 6B, metal wires 72 form a ring encircling dies 10. Metal lines 164 extend from the bottom of dies 10, and extend outwardly to thermally couple to metal wires 72. Metal lines 264 extend from the bottom of interposer 100, and extend outwardly to thermally couple to heat spreader 76. There may be a plurality of metal lines 164 and 264 extending in different directions.

Figure 7:
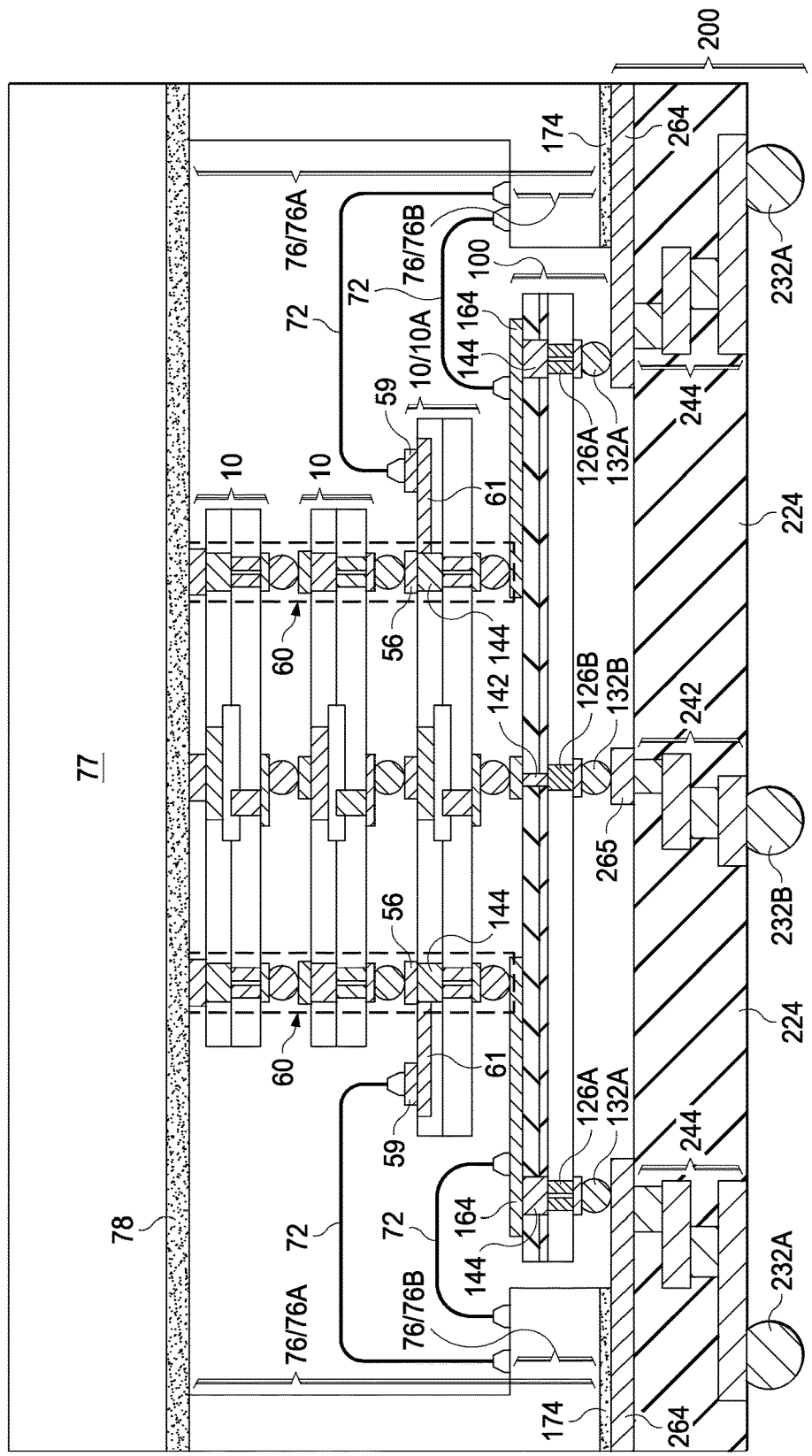
FIG. 7 illustrates a cross-sectional view of a package in accordance with alternative embodiments.

FIG. 7 illustrates a package in accordance with alternative embodiments. These embodiments are similar to the embodiment in FIGS. 6A and 6B, except that additional metal wires are bonded to surface 76B' of heat spreader portion 76B and metal pads 59. Metal pads 59 are in one of dies 10, which is also denoted as 10A. Metal pads 59 may be electrically connected to seal rings 44 through metal features 61, which may be metal lines. Accordingly, the heat in seal ring 44 may be effectively conducted to metal pads 59 through the metal-comprising paths formed of metal features 61. In some embodiments, metal pads 59 are discrete pads that are separated from each other. In alternative embodiments, the illustrated metal pads 59 are portions of a continuous metal ring in the top view of the package in FIG. 7. Although FIG. 7 illustrates the embodiments that metal features 59 are physically separated from metal features 56, in alternative embodiments, metal pads 59 and metal features 56 may be parts of the same continuous features.

In the embodiment, the seal rings and through-vias in dies are used as thermal conductors to conduct the heat generated in dies. Since the seal rings and through-vias may be formed of metals, which are good thermal conductors, the seal-ring-comprising thermal paths are effective in conducting heat. The connecting of metal wires 72 and heat spreader 76 to the seal ring and through-vias results in a further improvement in the heat conduction efficiency. The heat generated in the dies may thus be conducted more efficiently. Simulation results indicated that when seal-ring-comprising thermal paths are not used, the respective package including stacked dies and an interposer has a $\Psi jc$ value equal to about 0.99 K/W, wherein the $\Psi jc$ value is a measurement of the temperature difference caused by the generated heat. Greater $\Psi jc$ values indicate that the heat dissipation efficiency is worse, and smaller $\Psi jc$ values indicate that the heat dissipation efficiency is better. As a comparison, in the embodiments, the package having the seal-ring-comprising thermal paths has a $\Psi jc$ value equal to about 0.88 K/W, which indicates that better heat dissipation is achieved, and the temperature of the resulting package is lower.

In accordance with embodiments, a package includes a die, which includes a semiconductor substrate, a plurality of through-vias penetrating through the semiconductor substrate, a seal ring overlapping and connected to the plurality of through-vias, and a plurality of electrical connectors underlying the semiconductor substrate and connected to the seal ring. An interposer is underlying and bonded to the die. The interposer includes a substrate, and a plurality of metal lines over the substrate. The plurality of metal lines is electrically coupled to the plurality of electrical connectors. Each of the plurality metal lines has a first portion overlapped by the first die, and a second portion misaligned with the die. A heat spreader encircles the die and the interposer. A wire includes a first end bonded to one of the plurality of metal lines, and a second end bonded to the heat spreader.

In accordance with other embodiments, a device die includes a semiconductor substrate, a plurality of through-vias penetrating through the semiconductor substrate, a seal ring overlapping and electrically coupled to the plurality of through-vias, and a plurality of electrical connectors overlying and electrically coupled to the seal ring. An interposer is underlying and bonded to the device die. The interposer includes a plurality of metal lines, wherein each of the plurality of metal lines is bonded to one of the plurality of electrical connectors of the device die. A heat spreader encircles the device die and the interposer. A metal wire has a first end bonded to the first heat spreader, and a second end bonded to one of the device die and the interposer.

In accordance with yet other embodiments, a method includes conducting heat in a die to a seal ring in the die, and conducting the heat from the seal ring to a metal line in an interposer. The interposer is underlying and bonded to the die. The metal line is electrically coupled to the seal ring through a through-via in a substrate of the die. The method further includes conducting the heat in the die and the interposer to a heat spreader through a metal wire.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a first die comprising a first seal ring comprising a plurality of sides adjacent to edges of the first die;
   a heat spreader encircling the first die;

a thermal conductive path connecting the heat spreader to the first seal ring, wherein an entirety of the thermal conductive path is formed of metal-containing features; and an interposer underlying and bonded to the first die through a first solder region, wherein the interposer comprises:
a substrate;
a metal line over the substrate, wherein the metal line forms a portion of the thermal conductive path, and the metal line is in contact with the first solder region;
a plurality of through-vias penetrating through the substrate of the interposer; and
a second seal ring over the substrate of the interposer, wherein the second seal ring is electrically coupled to the heat spreader.

2. The package of claim 1 further comprising:
a package substrate underlying and bonded to the interposer through a second solder region, wherein the package substrate comprises a plurality of additional metal lines electrically coupled to a plurality of metal lines in the interposer through metal features, wherein each of the additional plurality of metal lines comprises a first portion overlapped by the interposer, and a second portion misaligned with the interposer, and wherein the heat spreader is disposed over the second portions of the plurality of additional metal lines.

3. The package of claim 1 further comprising a plurality of solder regions underlying and electrically connected to the second seal ring.

4. The package of claim 1, wherein the heat spreader comprises a first portion and a second portion, and wherein a first top surface of the first portion is higher than a second top surface of the second portion, and the package further comprises an adhesive comprising:
a first surface in contact with the second portion of the heat spreader; and
a second surface opposite to the first surface, wherein the second surface is in contact with the interposer.

5. The package of claim 1, wherein the first die further comprises:
a first semiconductor substrate; and
a first plurality of through-vias penetrating through the first semiconductor substrate, wherein the first plurality of through-vias are overlapped by, and connected to, the first seal ring.

6. The package of claim 5 further comprising:
a thermal interface material over and contacting the heat spreader, wherein a first top surface of the thermal conductive path and a second top surface of the heat spreader are in contact with a same bottom surface of the thermal interface material; and
an additional heat spreader over and contacting the heat spreader.

7. The package of claim 1, wherein the first seal ring is electrically floating.

8. The package of claim 1, wherein the first seal ring is electrically grounded.

9. A package comprising:
a device die comprising:
a semiconductor substrate;
a plurality of through-vias penetrating through the semiconductor substrate;
a seal ring overlapping and electrically coupled to the plurality of through-vias; and
a metal line connected to the seal ring; and
a heat spreader encircling the device die; and
a first metal wire comprising a first end bonded to the heat spreader, and a second end bonded to the metal line of the device die.

10. The package of claim 9, wherein the seal ring comprises four sides, each adjacent to an edge of the device die, and wherein each of the four sides is bonded to a second metal wire that is further bonded to the heat spreader.

11. The package of claim 9 further comprising an interposer underlying and bonded to the device die through solder regions, wherein the interposer further comprises an additional seal ring, and wherein the addition seal ring is connected to the heat spreader through an all metal-containing thermal path.

12. The package of claim 9, wherein the seal ring is electrically floating.

13. The package of claim 12, wherein the device die further comprises an additional metal line, and the package further comprises a second metal wire comprising a first end bonded to the heat spreader, and a second end bonded the second metal line of the device die.

14. A method comprising:
conducting heat in a die to a seal ring in the die;
conducting the heat in the seal ring to a first solder region;
conducting the heat in the first solder region to an interposer, wherein the heat is conducted to a metal line in the interposer, and from the metal line to a through-via in a semiconductor substrate of the interposer;
conducting the heat from the metal line to a metal wire; and
conducting the heat from the metal wire to a heat spreader, wherein the metal wire directly connects the metal line in the interposer to the heat spreader, and the metal wire comprises a portion suspended in a space between the interposer and the heat spreader, and the portion of the metal wire is spaced apart from both the interposer and the heat spreader.

15. The method of claim 14, wherein the metal wire comprises a first end bonded to the heat spreader, and a second end bonded to a metal feature of the die, and wherein the metal feature of the die is electrically coupled to the seal ring of the die through all metal features.

16. The method of claim 14, wherein the metal line is electrically coupled to the seal ring through a through-via penetrating through a substrate of the die.

17. The method of claim 14, wherein the heat spreader encircles the die, and wherein the method further comprises conducting the heat through a plurality of metal wires that is bonded to the heat spreader.

18. The method of claim 14 further comprising:
conducting the heat from the seal ring to a metal line of a package substrate, wherein the metal line of the package substrate is electrically coupled to the seal ring; and
conducting the heat from the metal line of the package substrate to the heat spreader, wherein the heat spreader is disposed overlapping a portion of the metal line of the package substrate.

19. The package of claim 1, wherein the interposer comprises:
a semiconductor substrate; and
a through-via penetrating through the semiconductor substrate, wherein the through-via is connected to the thermal conductive path through the metal line.

* * * * *